(12) United States Patent
Richardson et al.

(10) Patent No.: US 10,164,738 B2
(45) Date of Patent: Dec. 25, 2018

(54) INTERLACING METHOD FOR HIGH THROUGHPUT FORWARD ERROR CORRECTION

(71) Applicant: QUALCOMM Incorporated, San Diego, CA (US)

(72) Inventors: Thomas Joseph Richardson, South Orange, NJ (US); Vincent Abayomi Loncke, Piscataway, NJ (US)

(73) Assignee: QUALCOMM Incorporated, San Diego, CA (US)

( * ) Notice: Subject to any disclaimer, the term of this patent is extended or adjusted under 35 U.S.C. 154(b) by 36 days.

(21) Appl. No.: 15/377,707

(22) Filed: Dec. 13, 2016

(65) Prior Publication Data

US 2017/0180079 A1    Jun. 22, 2017

Related U.S. Application Data

(60) Provisional application No. 62/268,185, filed on Dec. 16, 2015.

(51) Int. Cl.
*H03M 13/27* (2006.01)
*H04L 1/00* (2006.01)

(52) U.S. Cl.
CPC .......... *H04L 1/0061* (2013.01); *H03M 13/27* (2013.01); *H04L 1/0042* (2013.01);
(Continued)

(58) Field of Classification Search
CPC ... H04L 1/0061; H04L 1/0071; H04L 1/0042; H04L 1/0065; H04L 1/0041; H03M 13/27
(Continued)

(56) References Cited

U.S. PATENT DOCUMENTS 7,676,735 B2* 3/2010 Luby ................. H03M 13/1515
714/755
8,352,840 B2* 1/2013 Crozier ............... H03M 13/296
714/780
(Continued)

OTHER PUBLICATIONS

Draft ETSI TS 102 034., "Digital Video Broadcasting (DVB); Transport of MPEG-2 TS Based DVB Services over IP Based Networks," Oct. 13, 2008, V1.4.1, pp. 1-226, XP017825992.
(Continued)

*Primary Examiner* — James C Kerveros
(74) *Attorney, Agent, or Firm* — Norton Rose Fullbright LLP

(57) ABSTRACT

Encoders, decoders and methods of encoding and decoding data can comprise receiving source symbols in a first sequence, storing the source symbols to a first memory in a second sequence, wherein the first sequence is a first interlacing relative to the second sequence, determining if the memory contains all source symbols of a codeword, wherein the source symbols of a codeword are the symbols used to generate repair symbols for that codeword, generating repair symbols for the codeword, storing the repair symbols to a second memory in a third sequence, interlacing the repair symbols and the source symbols into an output stream as a stream of encoded symbols, wherein the repair symbols appear in the output stream in a fourth sequence, wherein the fourth sequence is a second interlacing relative to the third sequence, and outputting the stream of encoded symbols.

12 Claims, 14 Drawing Sheets

(52) U.S. Cl.
CPC .......... *H04L 1/0071* (2013.01); *H04L 1/0041* (2013.01); *H04L 1/0065* (2013.01)

(58) Field of Classification Search
USPC ......................................................... 714/755
See application file for complete search history.

(56) References Cited

U.S. PATENT DOCUMENTS

| | | | |
|---|---|---|---|
| 9,413,494 B2* | 8/2016 | Luby | .................... H04L 1/0643 |
| 2006/0279437 A1* | 12/2006 | Luby | ................. H03M 13/1515 |
| | | | 341/50 |
| 2007/0055919 A1* | 3/2007 | Li | .................... H03M 13/2957 |
| | | | 714/755 |
| 2007/0300127 A1* | 12/2007 | Watson | ................. H03M 13/03 |
| | | | 714/758 |
| 2009/0204877 A1* | 8/2009 | Betts | .................... H04L 1/0057 |
| | | | 714/806 |
| 2014/0250344 A1 | 9/2014 | Hellge et al. | |

OTHER PUBLICATIONS

International Search Report and Written Opinion—PCT/US2016/066528—ISA/EPO—dated Mar. 20, 2017.

\* cited by examiner

FIG. 9

INTERLACING METHOD FOR HIGH THROUGHPUT FORWARD ERROR CORRECTION

CROSS REFERENCE TO RELATED APPLICATION

This application claims benefit under 35 U.S.C. § 119(e) to U.S. Provisional Patent Application No. 62/268,185 entitled "INTERLACING METHOD FOR HIGH THROUGHPUT FORWARD ERROR CORRECTION" filed on Dec. 16, 2015, the disclosure of which is hereby incorporated by reference in its entirety.

BACKGROUND

Field of the Disclosure

The described technology generally relates to transmitting data with forward error correction (FEC). More specifically, the disclosure is directed to devices, systems, and methods related to interlacing transmitted data for use in a high throughput system that uses forward error correction to provide for improved performance.

Description of Related Art

Forward error correction (FEC) is used on communication channels where there is a chance that data can be lost or corrupted. With some communication channels, such as a packet network where packets are likely to be discarded if corrupted, the channel would experience erasures much more than corruption, but FEC can be used in both cases to recover from losses. With FEC, an encoder encodes the source data to be sent with some repair data that can be used at a decoder to recover from losses. Typically, the encoder is used at or near a transmitter and the decoder is used at or near a receiver.

Sometimes source data is available at the transmitter in advance and can be encoded well before the encoded data needs to be transmitted, but for many streaming applications, the latency between the time the source data is made available to the transmitter and encoder and the time the source data is output by the receiver needs to be very small. Latency might be in part a function of the type of FEC coding used and might be in part a function of how much hardware or processing power is available to encoders and decoders. For example, FEC encoding that applies repair data over a large span of the source data might result in added latency as a decoder has to wait to receive repair data to recover for much earlier sent source data.

SUMMARY

The implementations disclosed herein each have several innovative aspects, no single one of which is solely responsible for the desirable attributes of the present disclosure. Without limiting the scope of the invention, as expressed by the claims that follow, the more prominent features will be briefly disclosed here. After considering this description, one will understand how the features of the various implementations provide several advantages over current systems.

Encoding data for transmission can comprise receiving source symbols in a first sequence, storing the source symbols to a first memory in a second sequence, wherein the first sequence is a first interlacing relative to the second sequence, determining if the memory contains all source symbols of a codeword, wherein the source symbols of a codeword are the symbols used to generate repair symbols for that codeword, generating repair symbols for the codeword, storing the repair symbols to a second memory in a third sequence, interlacing the repair symbols and the source symbols into an output stream as a stream of encoded symbols, wherein the repair symbols appear in the output stream in a fourth sequence, wherein the fourth sequence is a second interlacing relative to the third sequence, and outputting the stream of encoded symbols.

An encoder might receive additional source symbols in the first sequence, store them in the first memory in the second sequence, determine which of the additional codewords are complete codewords in the first memory, and for each of the complete codewords, generate repair symbols by storing the repair symbols for each of the complete codewords to the second memory in the third sequence and interlacing the repair symbols and the source symbols for each of the complete codewords into the output stream as the stream of encoded symbols prior to the outputting of the stream of encoded symbols.

The first interlacing and the second interlacing can be equal. The first interlacing and the second interlacing can be determined from a target line rate, a specified protection period, and a specified symbol size. An encoding schedule might be generated in advance of receiving the source symbols, with allocation of codewords in the encoding schedule to stagger completion times of the codewords, wherein a completion time of a given codeword is a time at which a decoder obtains, or is scheduled to obtain, a last symbol of the given codeword. The first memory and the second memory can be distinct memory locations in one common memory structure.

An encoder and a decoder operating using the interlacing methods are contemplated. An encoder for encoding data for transmission might comprise an input for receiving source symbols in a first sequence, a first memory having storage for the source symbols corresponding to a codeword, wherein the source symbols corresponding to the codeword are the symbols used to generate repair symbols for the codeword, logic for storing the source symbols of the codeword to the first memory in a second sequence, wherein the first sequence is a first interlacing relative to the second sequence, a repair encoder for generating repair symbols for the source symbols of the codeword, a second memory having storage for storing the repair symbols in a third sequence, an interlacer that interlaces the repair symbols and the source symbols into an output stream as a stream of encoded symbols, wherein the repair symbols appear in the output stream in a fourth sequence, wherein the fourth sequence is a second interlacing relative to the third sequence, and an output for outputting the stream of encoded symbols.

A decoder for decoding data for transmission might comprise an input for receiving received encoded symbols from a communication channel in a transmitted first sequence, wherein the received encoded symbols are logically associated with a codeword, a first memory having storage for the received encoded symbols, logic for storing received encoded symbols of the codeword to the first memory in a second sequence, wherein the transmitted first sequence is a first interlacing relative to the second sequence, a pass-through for passing received source symbols through to an output buffer, logic for determining whether any source symbols of the codeword are missing in the first memory, a repair decoder for generating recovered source symbols corresponding to the source symbols, if any, of the codeword that are missing in the first memory, and a second memory having storage for caching cached source symbols that are later in a stream when outputting recovered source symbols that are earlier in the stream.

Decoding data for transmission can comprise receiving encoded symbols from a communication channel in a transmitted first sequence, wherein the encoded symbols are logically associated with a codeword, storing received encoded symbols of the codeword to a first memory in a second sequence, wherein the transmitted first sequence is a first interlacing relative to the second sequence, passing received source symbols through to an output buffer, determining whether any source symbols of the codeword are missing in the first memory, generating recovered source symbols corresponding to the source symbols, if any, of the codeword that are missing in the first memory, and caching source symbols that are later in a stream when outputting recovered source symbols that are earlier in the stream.

The following detailed description together with the accompanying drawings will provide a better understanding of the nature and advantages of the present invention.

BRIEF DESCRIPTION OF THE DRAWINGS

The above-mentioned aspects, as well as other features, aspects, and advantages of the present technology will now be described in connection with various implementations, with reference to the accompanying drawings. The illustrated implementations, however, are merely examples and are not intended to be limiting. Throughout the drawings, similar symbols typically identify similar components, unless context dictates otherwise. Note that the relative dimensions of the following figures may not be drawn to scale.

FIG. 9 illustrates a transmission sequence corresponding to the example of FIG. 8 using the pattern in FIG. 7.

DETAILED DESCRIPTION

In the following detailed description, reference is made to the accompanying drawings, which form a part of the present disclosure. The illustrative implementations described in the detailed description, drawings, and claims are not meant to be limiting. Other implementations may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and form part of this disclosure.

In a specific example, a transmitter includes an encoder that encodes source data as it is received that is transmitted before all of the source data to be transmitted is received at the transmitter and one or more receivers each has a decoder that receives symbols, recovers symbols that are lost in transmission if possible, and outputs the received data such that the received data is the same as the source data and is output with little delay relative to when the transmitter received the source data.

The source data that is to be sent from a transmitter to a receiver (or to more than one receiver simultaneously) can be thought of as being partitioned into symbols. An encoder is a computer system, device, electronic circuit, or the like, that generates encoded symbols from a sequence of source symbols and a decoder is the counterpart that recovers a sequence of source symbols from received or recovered symbols. In some cases, the encoder and/or the decoder have hardware limitations, such as the need to operate within the constraints of a portable and/or mobile device, such as a smartphone or other size and power constrained device, yet still provide good performance, robust error recovery, low latency, and small power consumption.

The source symbols can be grouped into codewords, wherein the repair symbols for a codeword are usable for recovery of source symbols of that codeword. For example, k source symbols might be grouped into a codeword and r repair symbols generated for that codeword. A encoder would output N=k+r encoded symbols as the codeword and upon receiving the N encoded symbols or some subset of them, the decoder would use the received symbols to attempt to output the k source symbols, using the r repair symbols as needed.

Figure 1:
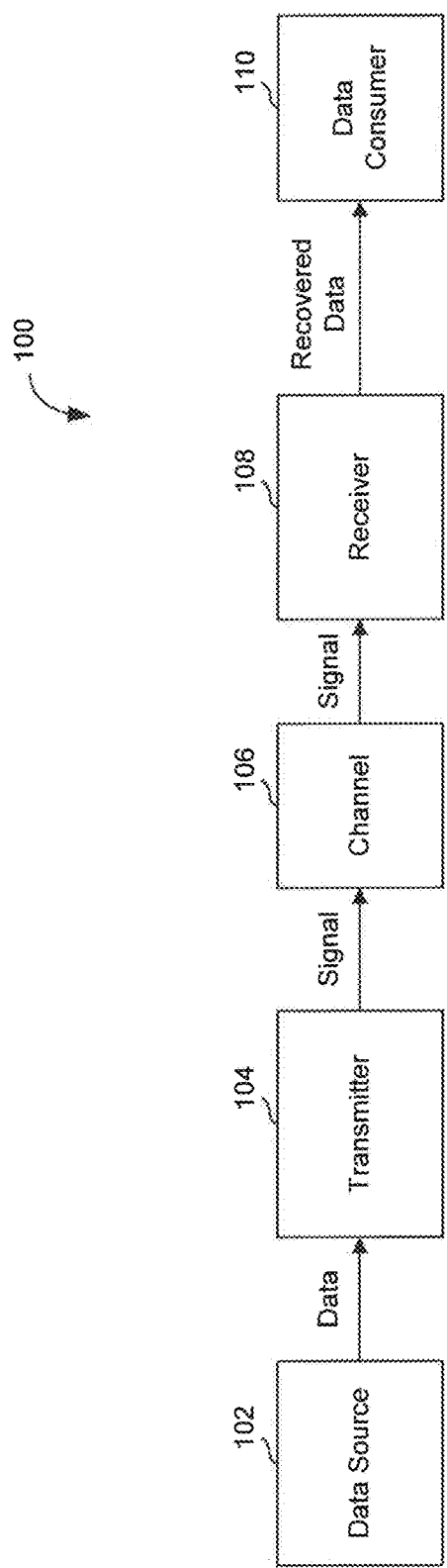
FIG. 1 is a block diagram of a transmission system and exemplary components.

FIG. 1 is a block diagram of a transmission system 100 and exemplary components. In this example, communication may occur over an optical beam channel from a transmitter to a receiver having an optical beam receiver. There might be multiple receivers (not shown in FIG. 1) and instead of optical beams, radio frequency (RF) antennae might be used to transmit wirelessly using radio frequency (RF) signals. It should be understood that the transmission system might also have applicability to other types of communication channels where erasure of transmitted data is possible.

As illustrated in FIG. 1, a data source 102 provides data to a transmitter 104, which in turn transmits a signal through a channel 106 and that signal, with some alterations possible, is received at a receiver 108, which attempts to recover the data that transmitter 104 encoded into the signal and output that recovered data to a data consumer 110. The particulars of the transmitter 104 and receiver 108 are constructed, as explained herein, to provide for low latency and high throughput with high decoder and encoder utilization.

The data source is the system or device or process that has data that needs to be available to the data consumer. As one specific example, the source of data frames might be an edge server that is serving up video content that a subscriber of a video streaming service requested and the data consumer is a video player running on a device owned or controlled by the subscriber, such as a mobile application for video streaming that runs on a smartphone where the smartphone also runs the receiver and decoder. In another specific example, the source of the data is an Internet Service Provider (ISP) and the consumer of the data is a router or gateway in a system for providing over-the-air Internet connectivity. Herein, the data might be organized into packets, wherein a packet is a unit of data that is either received entirely correctly or discarded entirely as a result of lower level network protocols. A packet might include multiple symbols, a single symbol per packet, a symbol distributed over multiple packets, or some combination.

Receiver 108 outputs data, preferably exactly the data received by transmitter 104, preferably using available decoder hardware efficiently and preferably with a low latency between when transmitter 104 receives the data and when receiver 108 outputs the data. Low latency might be important where the transmitter 104 is not able to get the data in advance and yet data consumer 110 expects the data to be available shortly after it is made available to transmitter 104.

Figure 2:
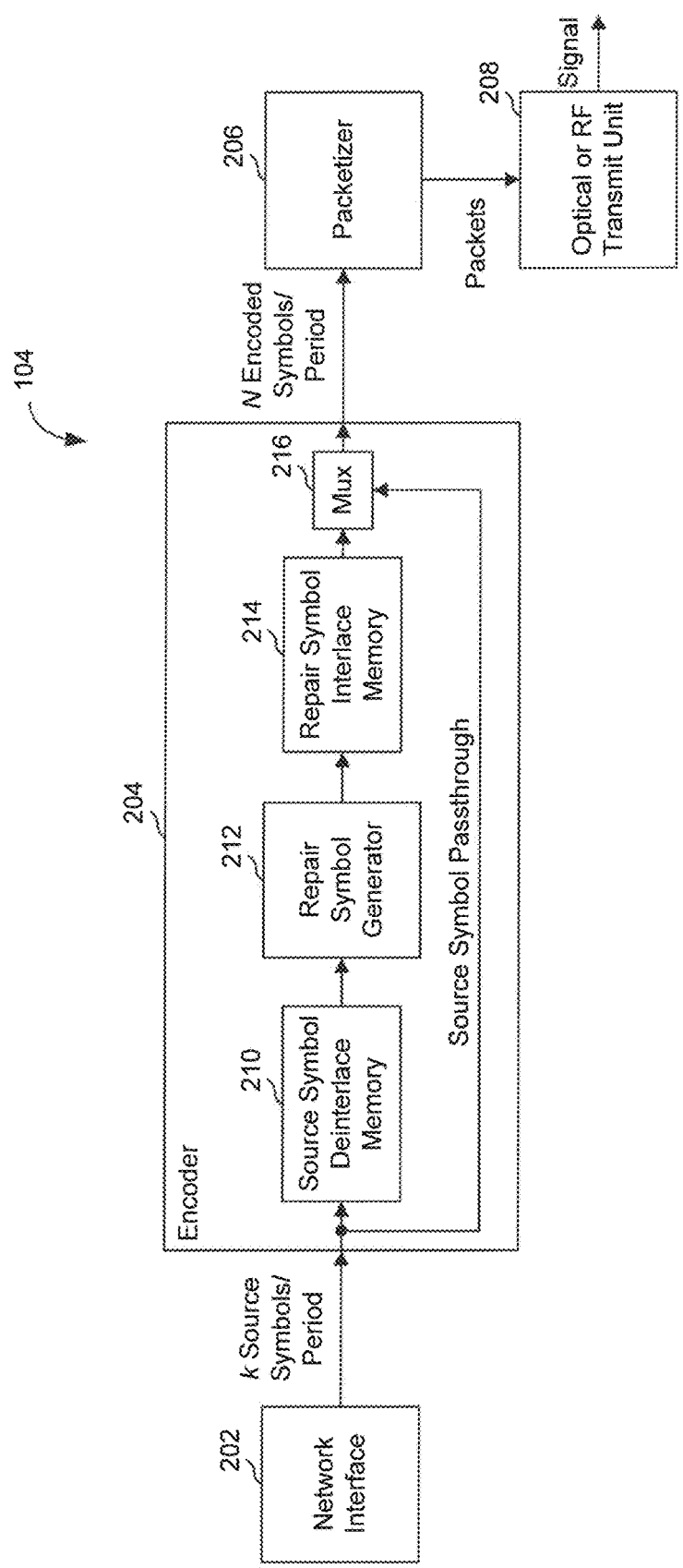
FIG. 2 is a block diagram of a transmitter as might be used in the transmission system of FIG. 1.

FIG. 2 illustrates additional detail of transmitter 104. As shown there, transmitter 104 has a network interface 202, as might be used to get data from a data source in the form of source symbols that can be grouped into groups of k source symbols per codeword period. Those source symbols are provided to an encoder 204 that outputs N=k+r encoded symbols for each k source symbols to a packetizer 206 that fills lower level protocol packets with the N encoded symbols and outputs packets to a transmit unit 208 that generates the signal that transmitter 104 outputs.

Encoder 204 of embodiments comprises a first memory, a source symbol deinterlace memory 210, a repair symbol generator 212, a second memory, a repair symbol interlace memory 214, and a multiplexer 216. Source symbol deinterlace memory 210 takes source symbols in a first sequence and outputs them in a second sequence, as detailed below, while repair symbol interlace memory 214 takes repair symbols in a third sequence and outputs them in a fourth sequence, as encoded symbols. Repair symbol generator 212, such as might be a RaptorQ encoder or other erasure coding module, generates r repair symbols for a codeword comprising k source symbols, resulting in N=k+r encoded symbols. Multiplexer 216 multiplexes the repair symbols and the source symbols for output of encoder 204. With a source symbol pass-through, the source symbols can appear at the output of encoder 204 without any reordering delay. The encoded symbols are then further processed and transmitted as the transmitted signal.

Figure 3:
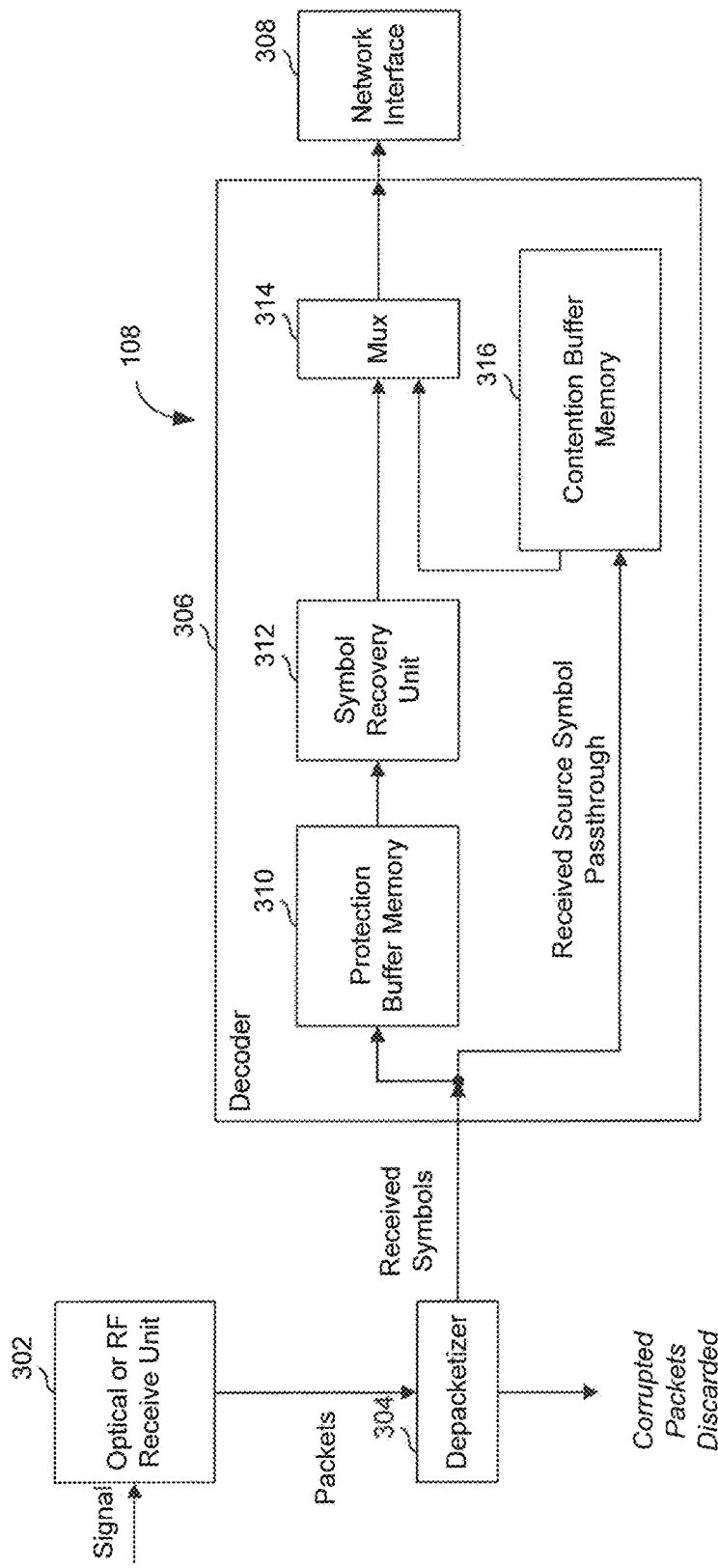
FIG. 3 is a block diagram of a receiver as might be used in the transmission system of FIG. 1.

FIG. 3 illustrates additional detail of receiver 108. As illustrated there, the signal is received at a receive unit 302 and passed as packets to a depacketizer 304. Depacketizer 304 extracts data from packets that are correctly received, passing them on to a decoder 306 while discarding corrupted packets. In this manner, decoder 306 can operate as an erasure decoder. Decoder 306 outputs the source symbols it recovers to a network interface 308.

Decoder 306 of embodiments includes a protection buffer memory 310, a symbol recovery unit 312, a multiplexer 314 and a contention buffer memory 316. Received symbols are provided on a pass-through to contention buffer memory 316 and can be passed through to multiplexer 314 and out to network interface 308 without delay as they are received. However, if it is desirable to have source symbols emitted from decoder 306 in the same order as they were presented to encoder 204, then if there is a lost source symbol that has yet to be recovered, the source symbols that come later are buffered in contention buffer memory 316.

Symbol recovery unit 312 might be a RaptorQ decoder or other erasure recovery module. Symbol recovery unit 312 operates on received symbols, which are source symbols and repair symbols, taking into account the interlacing that occurred at the transmitter, thus doing the inverse of that interlacing. When lost symbols are recovered, or as constant stream of lost and not lost symbols, symbols are output by symbol recovery unit 312 and multiplexer 314 might prioritize which symbols get output first as between symbols from symbol recovery unit 312 and symbols from contention buffer memory 316 based on the order of occurrence of the symbols.

Referring to FIG. 2 and FIG. 3, encoder 204 has sufficient information to determine an encoding schedule in advance of receiving each k source symbols, whereas decoder 306 might wait until receipt or non-receipt of encoded symbols to determine a decoding schedule, as a decoding schedule typically depends on which source symbols were lost and are in need recovery. Of course, a streaming application will likely send multiple codewords, each having k source symbols and N encoded symbols total, and as explained herein, the interlacing of the symbols provides desirable properties.

In an exemplary embodiment, the transmitted symbols are viewed as an interlacing of I interlaces. Codewords are interlaced in a staggered fashion to facilitate decoder pipelining and to provide a wider protection period for a codeword. In operation according to embodiments, a codeword is transmitted on a single interlace. The transmission of a codeword comprises transmitting information symbols followed by transmission of repair symbols usable for recovery or redundancy. The repair symbols of one codeword may be transmitted in time overlapping with the transmission of source symbols of subsequent codewords being transmitted on the same interlace. The number of interlaces can be chosen as a design consideration in conjunction with symbol size, transmission rate, transmission protection period etc.

As an example, suppose that because of transmission conditions it is desirable that the transmission of a codeword occur over a protection period, $T_{tr}$ seconds, over which the codeword is distributed for protection against losses. Assume that codewords are N symbols long and that the codeword symbols are approximately uniformly spaced in time during the protection period. Assume that I interlaces are cyclically used in the transmission, i.e., every I-th transmitted symbol is from the same interlace. Then the length of the protection period corresponds to the transmission time of NI symbols and the relation $N*I*T=T_{tr}*R$ holds, where R is the line rate in bits per second and T is the symbol size in bits. The information rate, the rate at which bits are arriving at the encoder for encoding, is k/N times the line rate. Assume each codeword comprises k information symbols followed by r repair symbols, which can be simple parity symbols or more complex redundant symbols that have values that are usable to decode or infer, possibly along with other information available at a receiver, values for one or more of the k information symbols. Notably, if none of the k information symbols are lost, the r repair symbols are not needed.

With each codeword comprising k information symbols followed by r repair symbols, on average only a first fraction, k/N, of the I interlaces are transmitting information symbols, while a second fraction, r/N, are transmitting repair symbols. Assuming information symbols are forwarded for transmission with minimal delay, information symbols are not arriving at the encoder in a cyclic fashion for each interlace. There are gaps in time, associated with the transmission of repair symbols for that interlace, during which information symbols are not accumulated for that interlace. Thus, at the encoder, the incoming symbols will not sample the interlaces cyclically, but will instead skip interlaces that are associated with transmission of repair symbols at that point.

Figure 4:
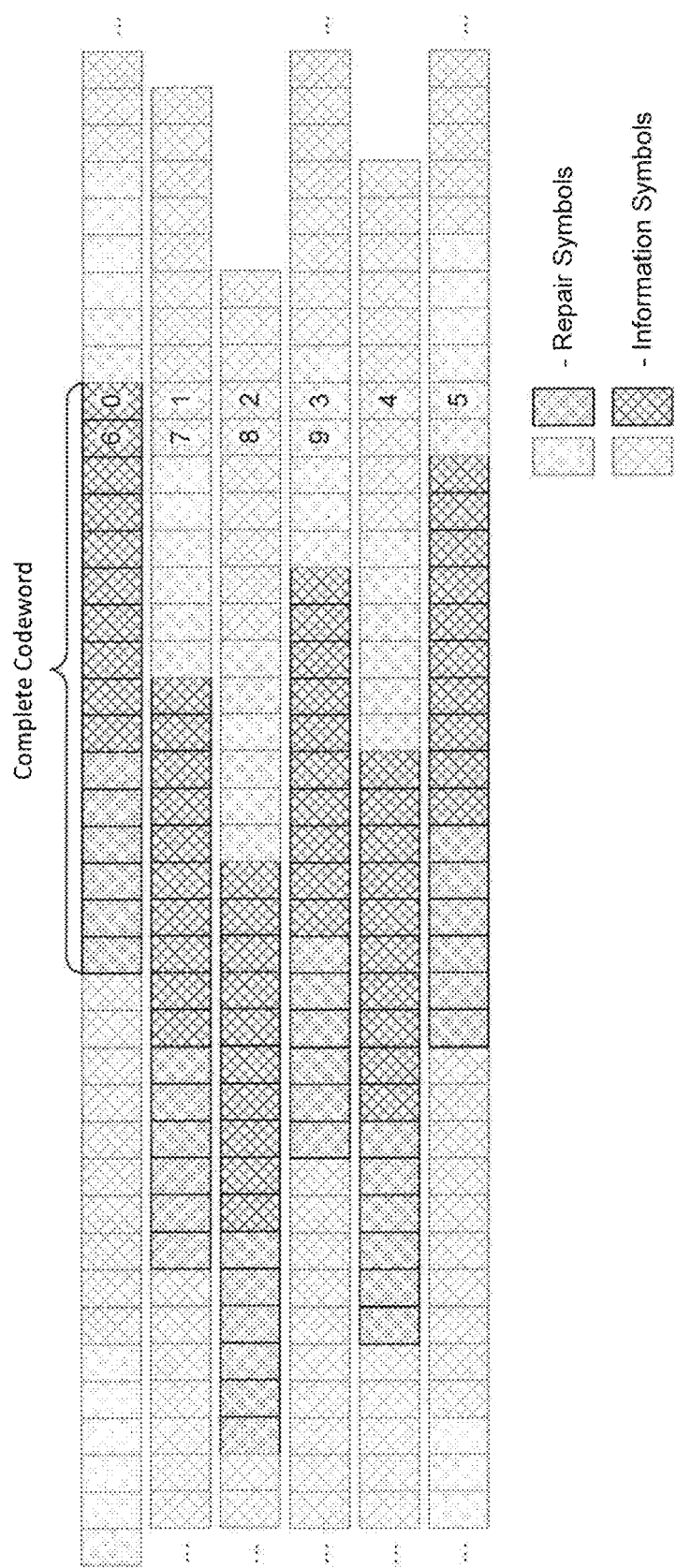
FIG. 4 illustrates consumption of symbols at an encoder.

FIG. 4 illustrates the consumption of symbols at the encoder. In the example shown, I=6, k=10, r=6, N=16. The cross-hatched slots represent information symbols, the stippled slots represent repair symbols, and the order of symbols is from right to left. The transmit order of symbols is vertically, top to bottom, and then right to left, as indicated by the symbol numbers 0 through 9 in FIG. 4. One complete codeword from each interlace is highlighted (darker than surrounding codewords). It can be observed that starting and ending positions of codewords are approximately uniformly spaced. The starting points of codewords are offset symbol-wise by 0, 17, 16, 16, 15, 16, 16, i.e., if the first information symbol of the first codeword starts at 0, then the first information symbol of the next codeword will start 17 symbols later, the second information symbol of the third codeword will start 16 symbols after that, and so on. Note that the entire structure is periodic. In this example, the gap in time between the last information symbol in a codeword and the first repair symbol in a codeword is equal to the transmission time used for I symbols. In some embodiments, it might be desirable to lengthen this gap to allow more time for encoding operations.

In this example, one codeword is spread over one protection period, $T_{tr}$, and since there are N codeword symbols, on average a new encoded symbol from the codeword is encountered by an encoder or decoder every $T_{tr}/I$ seconds, which is referred to herein as the "sample period." Thus, on a per codeword basis, the processor time allotted, $T_{proc}$, for processing the codeword is around $T_{proc}=T_{tr}/I$. This is assuming that encoding and decoding processing dedicated to this interlaced stream operates at a rate just sufficient to achieve the line rate throughput.

So, for a given T, N, and $T_{tr}$, the number of interlaces, I, can be selected according to the line rate. Typically N and I will be chosen to satisfy the above relation approximately and the transmission protection interval will be adjusted accordingly. In order to later characterize the relation between encoding and decoding latency and transmission periods, consider a parameter, a, that is determined according to:

$$N = a\sqrt{T_{tr} * R/T} \text{ and/or } I = \frac{1}{a}\sqrt{T_{tr} * R/T}$$

As mentioned above, in the current example, the time allotted for encoding without delaying information symbols is equal to $T_{proc}/a^2$. For large values of a, this represents an over-provisioning requirement on the encoder, since the time allotted is shorter than the average time allotted. Alternate embodiments of the interleaving of information and repair symbols can alleviate this problem.

The encoder might take into account, or be programmed for, coherence bandwidths suitable for the channel and a suitable protection period. This may be designed into the encoder and decoder or it might be programmable at runtime, or other variation. The coherence bandwidth might be an uncontrollable factor in a communication channel, but where it is predictable, the encoder and decoder in a communication system can be designed to assume a particular coherence bandwidth. For example, the communication system might be designed with an assumed coherence bandwidth of 5 to 10 ms (milliseconds). An example protection period might be 100 to 200 ms, which would provide between around 10 to 40 coherence intervals per protection period. The number of symbols per encoded codeword, N, might be selected to provide sampling coherence intervals at a fine granularity with N encoded symbols distributed across a protection period. In one example, N=400, but larger or smaller numbers for N could be used depending on what is needed. Each symbol has a symbol size, T, which might be a value such as 8 kilobytes ("KB") (64 K bits, or "64 Kb"), 32 KK (256 Kb), 128 KB (1,024 Kb), or 128 megabytes (1,024 Mb). For some implementations, 8 KB to 128 KB is likely a more practical range given interlacing and processor requirements.

As one specific example, given design parameters of T=32 KB, N=400, and $T_{tr}$=130 ms, to achieve a line rate of 100 Gb/s, I might be set at I=127 (100 Gb/s is about 256 Kb*400*127/130 ms). In this example, the sample period would be 130 ms/127=1.02 ms. Using the design parameter a, the number, N, of symbols in an encoded codeword might be set to approximately a*225, so for N=400, a would be equal to around 1.78. As another example, with $T_{tr}$=150 ms, R=100 Gb/s, and T=128 kB, N is approximately a*121. It can be assumed that a>1, so N and I are also greater than 1.

In a specific hardware embodiment, a transmitter is implemented into a compact optical transmitter board with a network interface capable of receiving data at a rate of up to 100 Gb/s (gigabits per second), perhaps using a parallel array of ten 10 gigabit Ethernet channels. The interlacing operation may be performed on the entire 100 Gb/s link or on a sub portion of that entire link, such as one or several of the ten gigabit Ethernet links. The optical transmitter board might include an array of ten transceivers, a field programmable gate array (FPGA chip) for performing the encoding, another FPGA for converting the data stream to an optical signal and outputting it. The compact optical transmitter board might be bi-directional, wherein the board implements both a transmitter and a receiver, possibly using some components for both directions of traffic. The encoder and decoder might operate using a RaptorQ encoding scheme for generating repair symbols.

Figure 5:
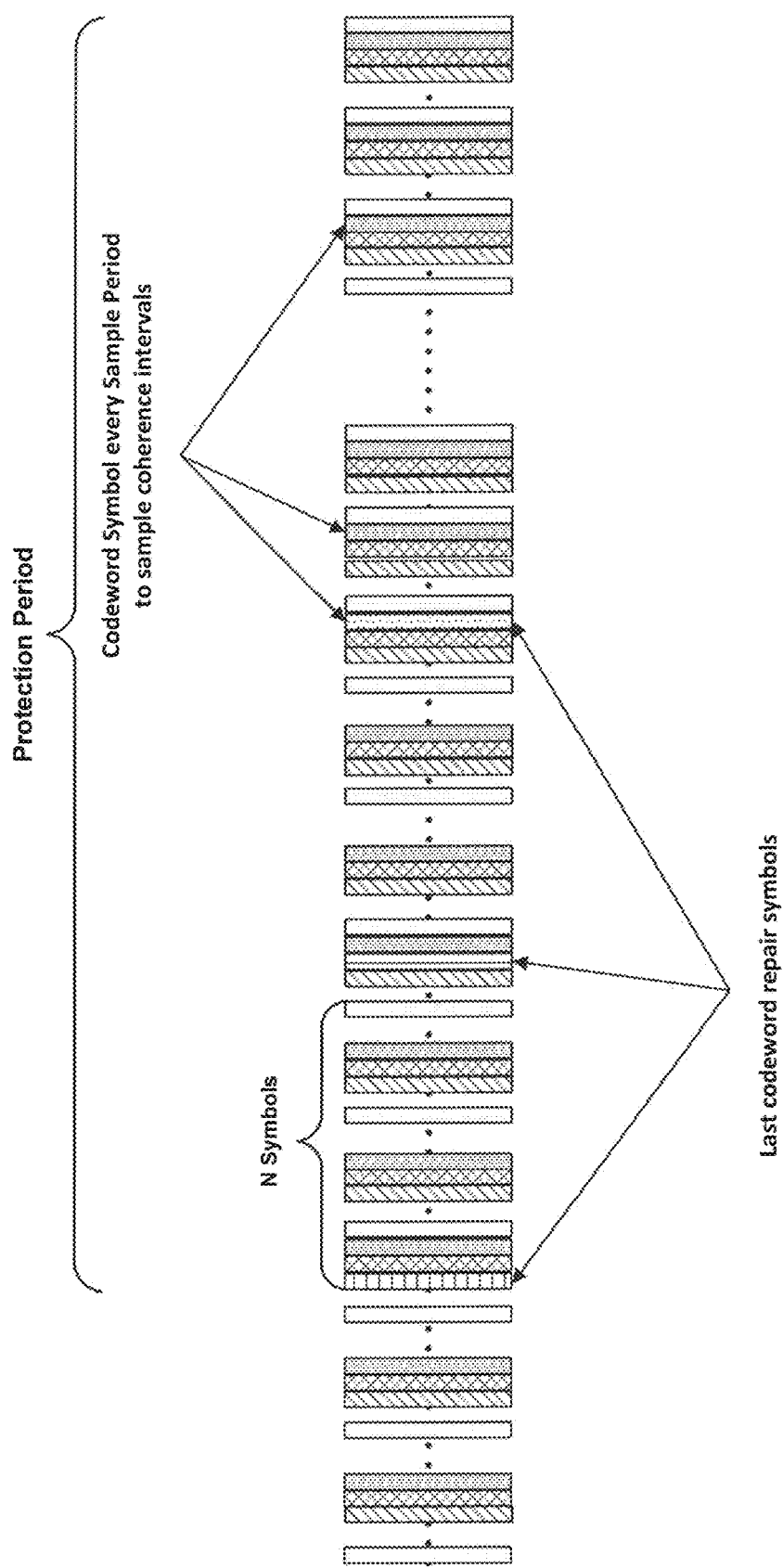
FIG. 5 is a transmission timeline illustrating consumption of symbols at an encoder in more detail.

FIG. 5 is a transmission timeline illustrating this in more detail. As illustrated, every sample period, there are I symbols, one symbol per interlace. The protection period has about N*I symbol intervals. Every N symbols, a codeword completes, as they are evenly spaced. At the encoder, when the receipt of the k source symbols is complete, the codeword information is known to the encoder and the r repair symbols can be generated shortly thereafter. At the decoder, when the receipt of the N receive symbols is complete, the codeword finishes and decoding can begin for recovery of missing source symbols. Decoding may begin earlier if a sufficient number of symbols have been received, but generally the decoder is designed with an assumption that decoding might not begin until the end of reception.

In order to relieve the constraint on encoding time, the interlacing might be such that on one interlace the repair symbols for a codeword do not immediately follow the source symbols for that codeword. This can be used to insert a gap in time between the last information symbol of a codeword and the first repair symbol of the same codeword to allow for encoding processing. In an exemplary embodiment, this can be provided by having two sets of interlaces, one for source symbols and one for repair symbols. The two sets of interlaces are themselves interleaved, so that on average for every k information symbols, there are r repair symbols. The ordering of interlaces on both information symbols and repair symbols could be the same as in the previous example, but now the repair symbol stream could be independently shifted in time to allow greater encoding time.

In general, the encoder would track the symbols to be able to flag when the last source symbol of a codeword is received, and the decoder would track the systems to be able to flag when a first repair symbol for a codeword is received and when a last repair symbol for a codeword is received. In the illustration of FIG. 5, the arrows below the timeline indicate last symbols for codewords. Note that they are approximately evenly distributed.

At the encoder, an encoding point is a point in the sequence when all k source symbols for a codeword have arrived at the encoder and that is when the encoder can kick off the encoding process for that lace. Encoding points occur on average every k source symbols (and correspondingly every N transmit symbols). In the example of regularly cyclically sampled interlaces, if N and I are coprime, then a codeword could complete every N transmitted symbols regularly and the end points would cycle through all the streams regularly.

If I and N are not coprime, then the encoder/decoder can perturb the encoding points to have a separation that varies among N−1, N, N+1, for example. In the example of FIG. 4, I and N are not coprime (N=16 and I=6). If I divides N, then other approaches can be taken, but it is not difficult to arrange encoding so that I does not divide N. For example, I might be set to I=139 and N set to some number not a multiple of 139, so that they are coprime.

The symbol counts between encoding points in the transmit sequence (e.g., 0, 17, 16, 16, 15, 16, 16 from the example of FIG. 4) form a periodic sequence of period N*I. In the case where I does not divide N, then let d>1 be the greatest common divisor of I and N. A repeating pattern such as the following suffices:

$$(N+1)^{d-1}(N)^{I/d-1}((N-1)(N)^{I/d-2})^{d-1}N$$

(N+1) symbols d times, and then N symbols I/d−1 times, etc.

In the case where I divides N, a variation to use might be N+2, N+1, N, N−1, N−2.

I even: $(N+2)^{I/2-1}(N+1)(N-2)^{I/2-1}(N-1)$

I odd: $(N+2)^{(I-1)/2}(N-1)(N-2)^{(I-3)/2}(N-1)$

Each of these sequences gives an average of N and hits each stream exactly once every I rounds.

For example, if 1<d<I, the sequence of decoding points is:

0,N+1, . . . ,(d−1)(N+1),(d−1)(N+1)+N, . . . ,(d−1)
(N+1)+(I/d−1)N,(d−1)(N+1)+(I/d−1)N+N−1, . . .

In that example, there are I terms in the sequence and each is distinct modulo I. The sequence then repeats periodically with a shift of N*I.

This can be verified as follows. If d is the greatest common divisor of k and I, denote N/d mod I/d as p. Then p is coprime to I/d. Hence the integers modulo I have a unique representation (j,r) j=0, . . . , I/d−1 and r=0, . . . , d−1 where (j,r) is equivalent to j p d+r. It follows that (j,r)+N= (j+1,r). If d=1 (N and I are coprime) then we may simply take the sequence $N^I$ which clearly suffices.

Assume 1<d<I and consider the sequence $(N+1)^{d-1}$ $(N)^{I/d-1}((N-1)(N)^{I/d-2})^{d-1}N$. Modulo I we obtain in the above representation (0,0), (1,1), . . . , (d−1,d−1) followed by (d,d−1), (d+1,d−1), . . . , (d−2+I/d,d−1)=(d−2,d−1). This (including (d−1,d−1)) covers all (j,r) with r=d−1. Following this we have (d−1,d−2), . . . , (d−3+I/d,d−2)=(d−3,d−2) which together with (d−2,d−2) covers all (j,r) with r=d−2. Following this we have (d−2,d−3), . . . , (d−4+I/d,d−3)=(d−4,d−3) which together with (d−3,d−3) covers all (j,r) with r=d−3. Continuing inductively in the last step, we have (1, 0), . . . , (−1+I/d,0) which together with (0,0) covers all (j,r) with r=0. The final additional step of size N takes (−1+I/d,0) back to (0,0) completing the cycle. The case d=I is simpler. When I is even, the sequence $(N+2)^{I/2-1}(N+1)(N-2)^{I/2-1}(N-1)$ gives, modulo I, the sequence 0, 2, 4, . . . , I−4, I−2, I−1, I−3, . . . , 1, 0. When I is odd, the sequence $(N+2)^{(I-1)/2}(N-1)(N-2)^{(I-3)/2}(N-1)$ gives, modulo I, the sequence 0, 2, 4, . . . , I−3, I−1, I−2, I−4, . . . , 1, 0.

Figure 6:
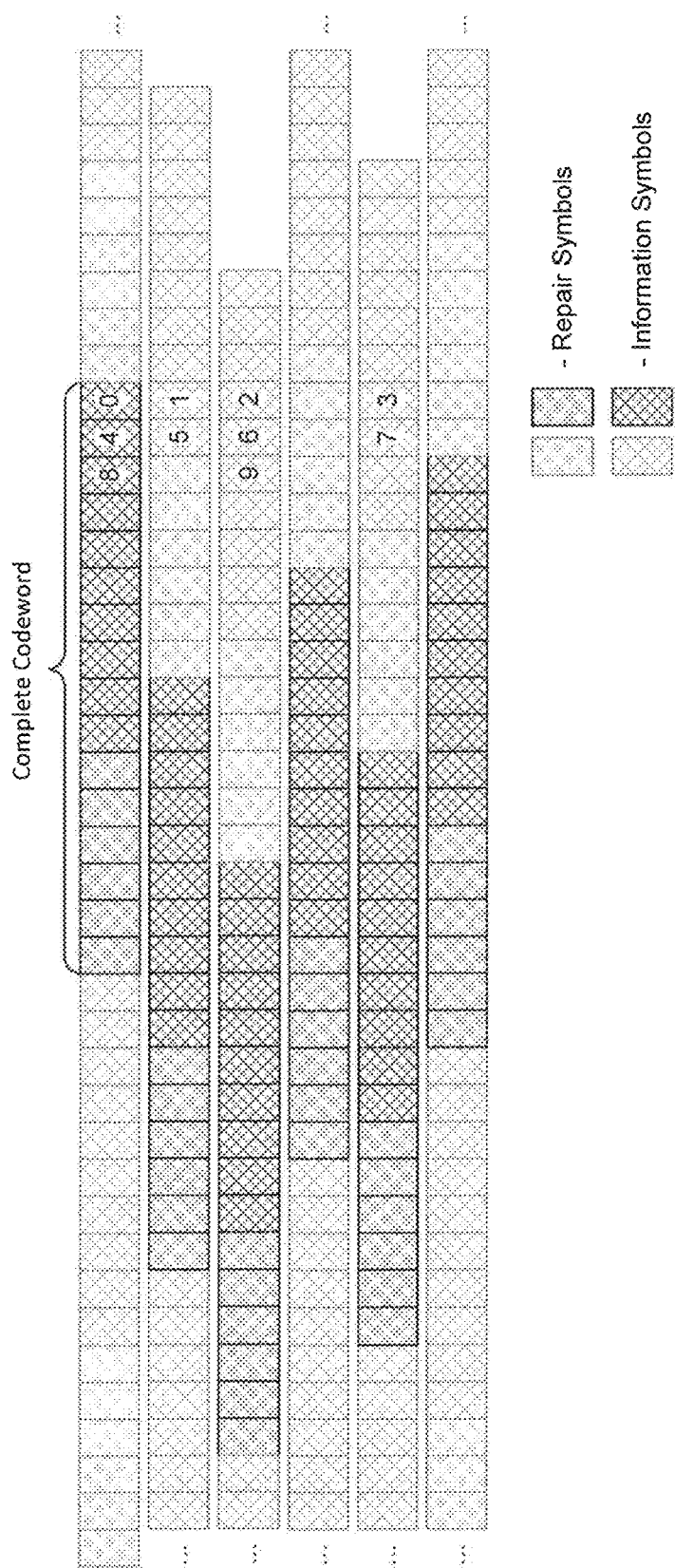
FIG. 6 illustrates an ordering of information symbols.

Once the transmission sequence is determined then the order in which incoming information symbols are assigned to interlaces follows directly. FIG. 6 shows the ordering of information symbols corresponding to the example in FIG. 4. In FIG. 6, I=6, k=10, r=6, and N=16. The order in which information symbols are assigned to interlaces is affected by the transmission structure.

After encoding, the symbol rate increases. As mentioned, the above example, with cyclically sampled interlaces at transmission, has the potential disadvantage of requiring either delayed transmission of information symbols. An alternative approach is to have separate streams for information and repair symbols that are interleaved together. With N=k+r encoded symbols for each k source symbols, one approach is to use a repeated pattern of N symbols where k are source symbols and r are approximately uniformly interleaved repair symbols. This can guarantee good interleaving between information and repair symbols so that the transmission of information symbols can proceed regularly with minimal additional delay.

Figure 7:
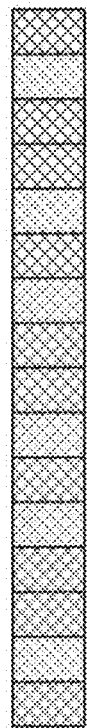
FIG. 7 illustrates an exemplary pattern of information symbols and repair symbols.
Figure 7:
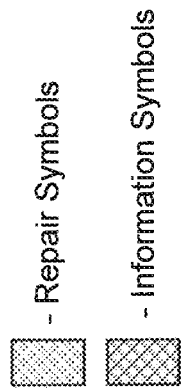
Figure 8:
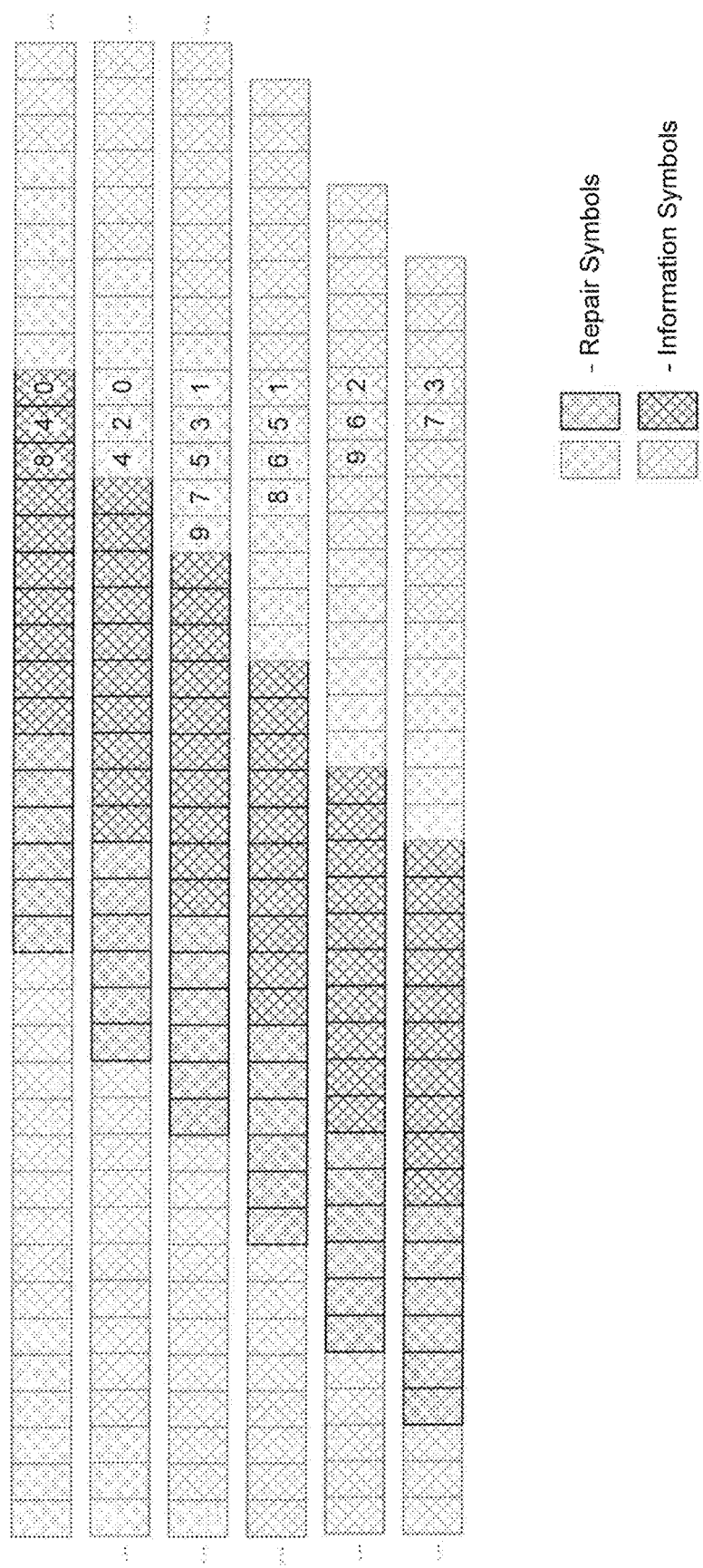
FIG. 8 illustrates an ordering pattern involving nearly constant shift staggering of codewords.
Figure 9:
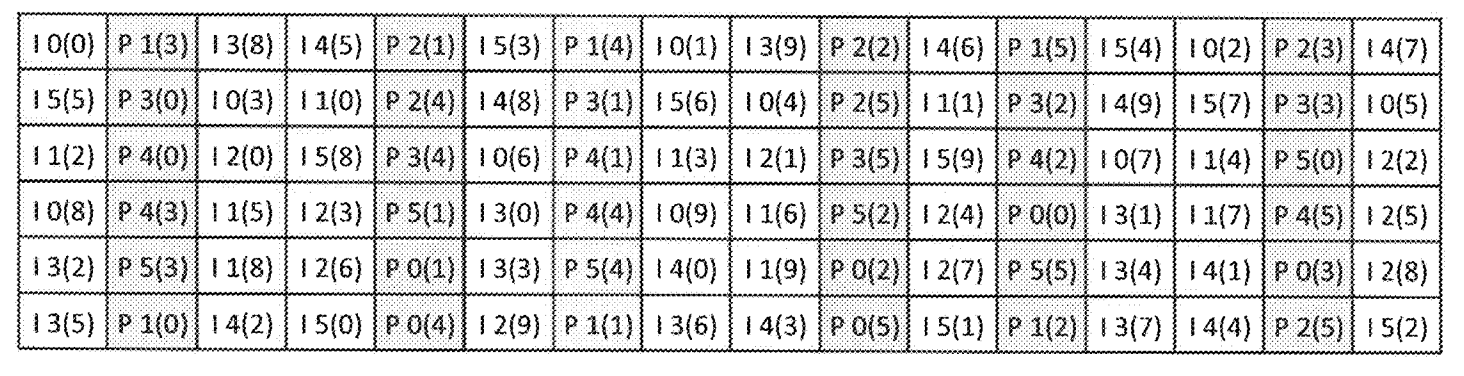

FIGS. 7, 8 and 9 illustrate an example of a design for positioning the repair symbols according to two interleaved sequences. If the throughput of the encoder is not substantially overprovisioned, then the time for encoding will be approximately the time for k source symbols. On the transmit stream, this corresponds to N symbol times. Since the encoding points are nearly uniformly placed and it is desirable to have the decoding points uniformly spaced, the design of the encoder might be such that the placement of the repair symbols reflects this, while leaving sufficient gap to allow encoding operations for each stream. By way of explanation, assume a transmission structure in which r repair symbols are interleaved with every k source symbols.

FIG. 7 illustrates an exemplary pattern with k=10, r=6, and N=16. This pattern of N symbols is repeated in a periodic fashion. For purposes of ordering and staggering interlaces, the encoder/decoder can use a more regular, or arbitrary arrangement of the staggering of the codewords.

FIG. 8 illustrates an example with a simple transmission structure involving nearly constant shift staggering of the codewords. There, I=6, k=10, r=6, and N=16. The crosshatched slots represent information symbols and the stippled slots represent repair symbols. The transmit order of symbols is vertically, top to bottom, and then right to left. In this case, however, the encoder and decoder are programmed or configured to use the structure to define information and repair symbol order independently. For actual transmission, the two streams are mapped into a sequence of symbols as in FIG. 7. In this way an offset (delay) between the end of the information symbols and the beginning of the repair symbols can be introduced to allow more time for encoding. The numerals in FIG. 8 indicate transmit order separately for information and repair symbols.

Alternate orders of the interlaces can give slightly more uniform spacing of the decoding points, such as the ordering in FIG. 4 or 6. In addition, schemes in which the shifts from codeword to codeword could be constant might also be used. Depending on the values of N and I, only certain transmission protection periods could be realized this way and the transmission structure may fail to be periodic over single codeword transmissions in each interlace. In such a case, the notion of cyclically sampled interlaces itself may no longer apply and instead the transmission could be understood as a sequence of codewords. Due to the finiteness of the parameters in the construction, the structure would be periodic but the period could be significantly longer than the protection period. In FIG. 8, the shifts of the codewords are not constant so that after I shifts, the total shift is equal to N, thus creating a periodic structure of length NI.

FIG. 9 illustrates the transmission sequence corresponding to the example in FIG. 8 using the pattern in FIG. 7. The transmission sequence indicated is the one directly induced by the ordering in FIG. 8. In FIG. 9, "I" indicates an information symbol and "P" indicates a parity (repair) symbol. Also, the first number indicates the interlace and the second number indicates the position of the symbol within the codeword. Because the information and parity streams are handled separately, however, an additional delay can be introduced into the parity sequence by shifting the parity transmission sequence some number of symbols in the parity sequence. Note that the shading of FIG. 9 matches the pattern of FIG. 7.

Figure 10:
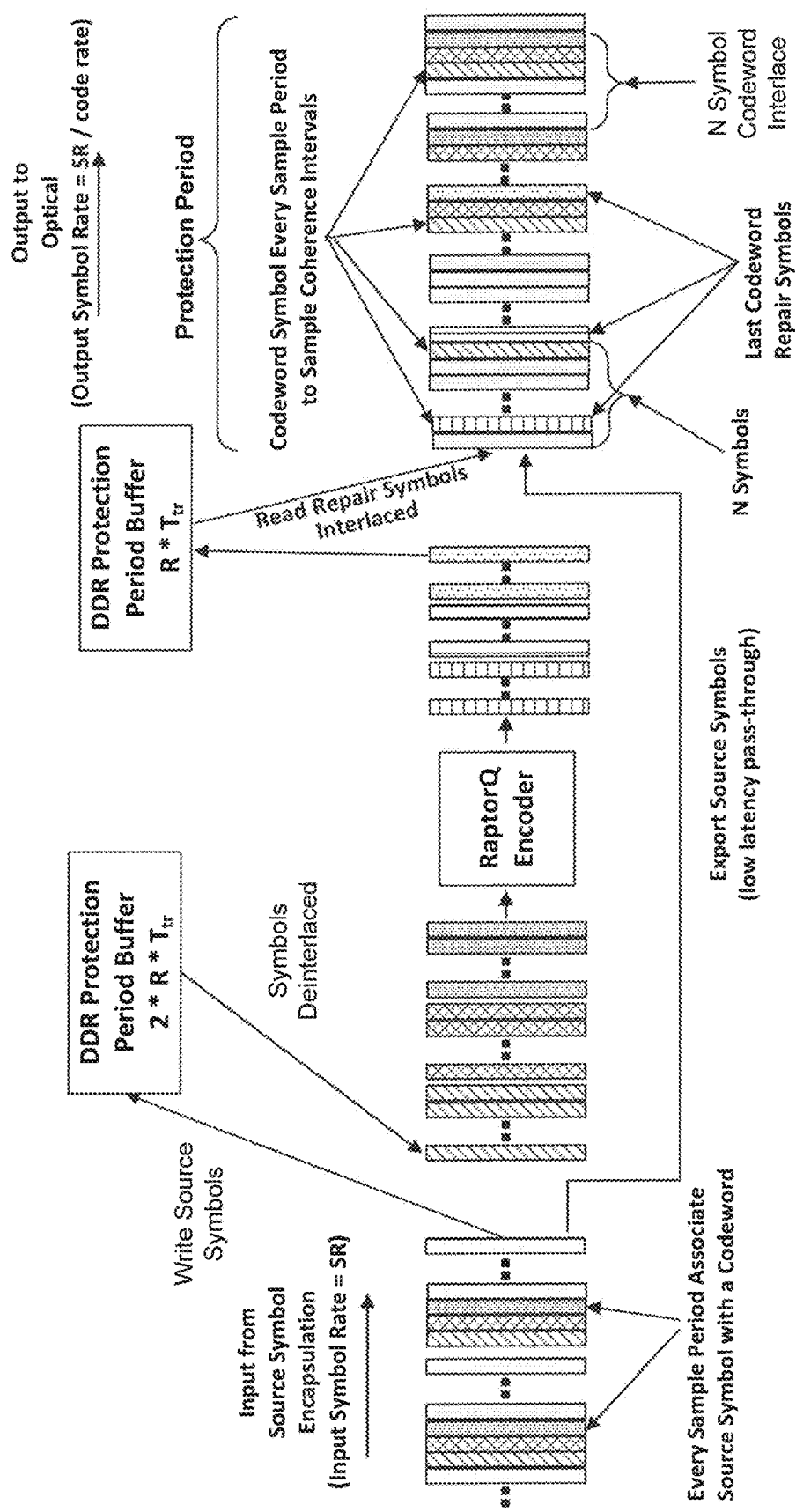
FIG. 10 illustrates an example encoder and operation thereof.

FIG. 10 illustrates an example encoder and operation thereof. The memory elements shown might be memory dedicated to single purposes or usable for multiple purposes. The first memory might be a double data rate (DDR) memory structure capable of storing twice the throughput of the system (R) over the protection period. Thus, where R=100 Gb/s and the protection period is 130 ms, the structure would store about 26 gigabits. For other values of throughput, protection period, etc., that number may vary.

As illustrated in FIG. 10, the source symbols (the symbols received at an input of the encoder/transmitter from the data source) are in a first sequence (order). This may be the order in which the source symbols are consumed, but in any case, it is a preferable order in which the source symbols might be output by the decoder. The encoder passes the source symbols through to an output stream to an interleaver to be interleaved with repair symbols. However, the encoder also stores the source symbols in a first memory in a second sequence. For that second sequence, one source symbol per sample period is obtained and stored with other symbols from other sample periods, so that a codeword of k source symbols is stored in the first memory in the second sequence, which is a deinterlacing of the first sequence.

Once all the source symbols for a codeword are available, the encoder passes those to a repair symbol generator, such as the RaptorQ encoder illustrated. In the meantime, there are other codewords (from other interlaces) for which symbols are accumulating in the first memory. As a result, the operation of the repair symbol generator is relatively smooth and sees a new codeword every N symbol periods or so.

A second memory, which might be part of the same physical memory chip or structure that implements the first memory, buffers the generated repair symbols. The encoder then interleaves the repair symbols and the source symbols. Note that the interlacing is such that the repair symbols for a codeword need not be adjacent to the source symbols for that codeword and in fact typically are not. Logically, the output of the encoder can be considered as I distinct substreams, with one symbol from each substream every I symbols in the output stream.

Figure 11:
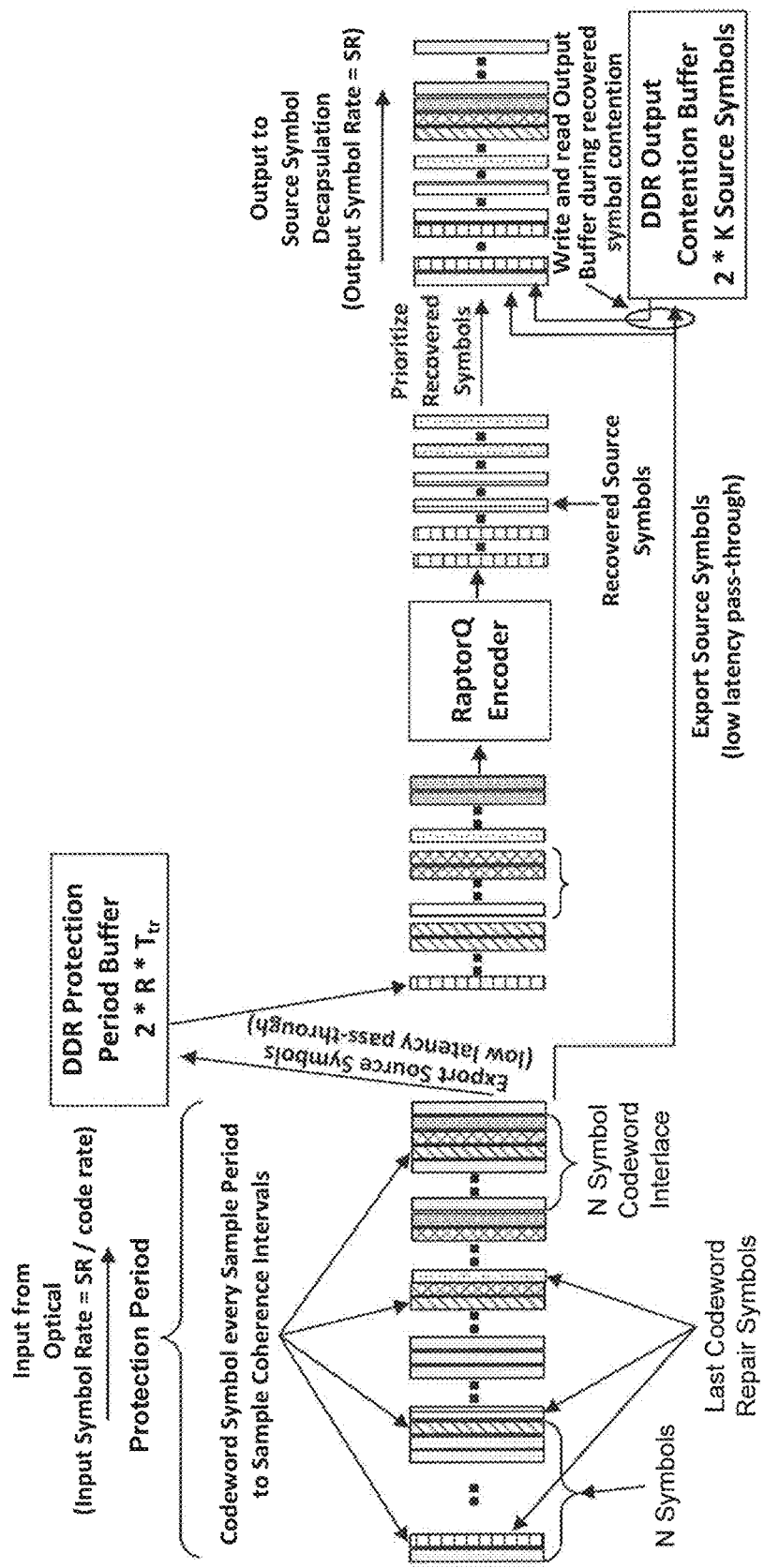
FIG. 11 illustrates the decoder and operations thereof.

FIG. 11 illustrates the decoder and operations there. As shown, the decoder receives symbols that were transmitted, possibly with some missing. The decoder includes a passthrough for the source symbols and also stores received symbols in a first decoder memory in a deinterlaced fashion. They are stored so that the decoder can easily pass the received symbols grouped by codeword to a repair decoder, shown here as a RaptorQ decoder. Thus, the repair decoder receives source symbols for a codeword, followed by the repair symbols for that codeword, then the source symbols for the next codeword, and so on.

The repair decoder outputs recovered source symbols. The repair decoder could also output some received source symbols, but that is not necessary with the pass-through. The repair decoder might determine just which source symbols are missing and output only those source symbols. Where symbols are operated on within the transmission system using electronic symbol identifiers (ESIs), then symbols need not be identified solely by their position within a stream.

Where the output of the decoder to the data consumer(s) is in source stream order, matching the order in which the data source supplied them to the transmitter, source symbols can be buffered at a second decoder memory so that received source symbols are held while recovery is occurring for other source symbols. The second decoder memory might also be used as a buffer to deal with the situation where there was a lag and now the decoder is able to output symbols at a rate greater than the line rate. In such cases, there might be contention between the passed-through source symbols and the recovered source symbols.

Figure 12:
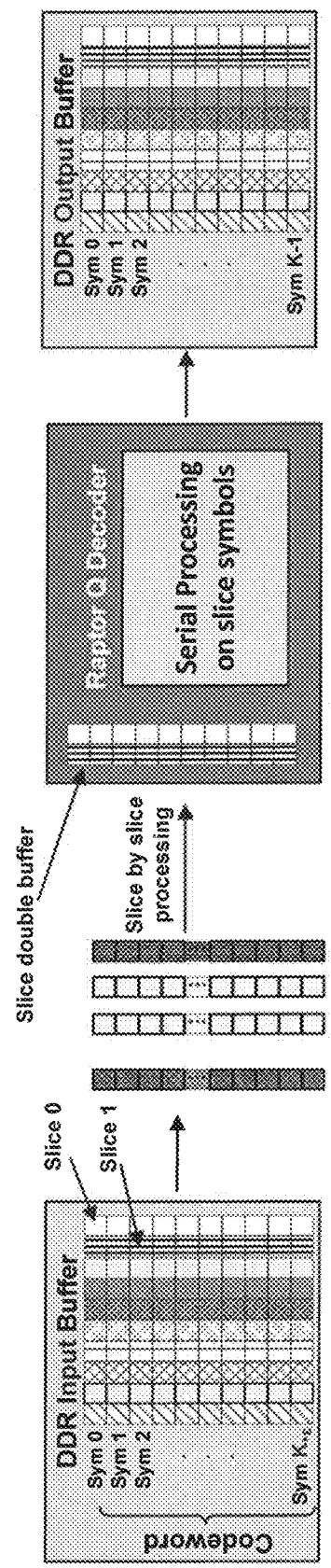
FIG. 12 illustrates the uses of the first decoder memory and the repair decoder in additional detail.

FIG. 12 illustrates the uses of the first decoder memory and the repair decoder in additional detail. As shown there, the vertical slices of memory correspond to portions of codewords and are processed from right to left. In the case of a RaptorQ decoder, there is a first stage of the repair decoder that computes the RaptorQ intermediate symbols and a second stage that uses a chain reaction decoding to generate any missing symbols.

Where limited FPGA internal memory precludes loading a complete codeword into the FPGA for processing, the complete codeword might be stored in the first decoder memory and processing broken up into multiple slices. The slice size might be determined from the amount of parallelism needed to meet the required throughput. In this example, one processing slice contains a portion of bits from all symbols in a codeword. An internal FPGA buffer might be dimensioned to hold a two processing slices at a time. Completed output symbols can then be built up from multiple completed slices in the second decoder memory, shown here as DDR output buffer. In one example, there are 200 source symbols per codeword (k=200), T=32 KB, and $T_{proc}$=1 ms. This would result in a slice size of 7 kilobits/symbol*(k+ε)~=1.43 megabits, for some small ε.

A parallelism parameter, P, is chosen so that processing rate can support the line rate. The FPGA buffer would be able to store around k*P bits. Intermediate RaptorQ symbols are generated based on those k*P bits and written to an intermediate symbol buffer in around 32*k clock cycles. Slices of repair/missing symbols are then generated over around 8*k cycles and written out to the second decoder memory.

Figure 13:
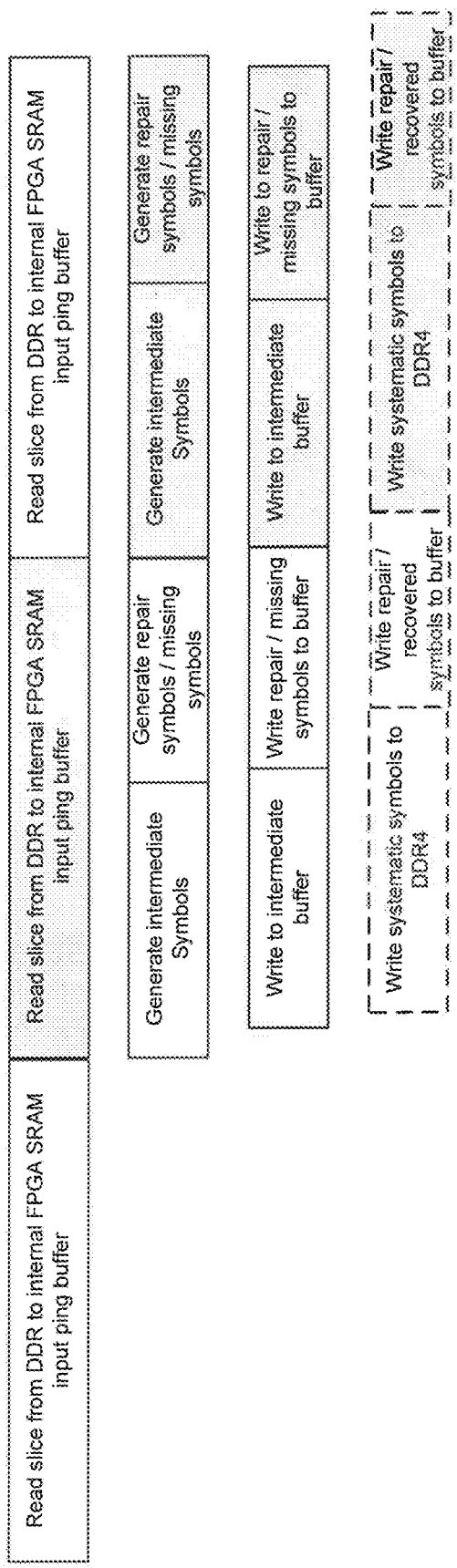
FIG. 13 illustrates a typical process for generating slices.

FIG. 13 illustrates a typical process for generating slices.

Figure 14:
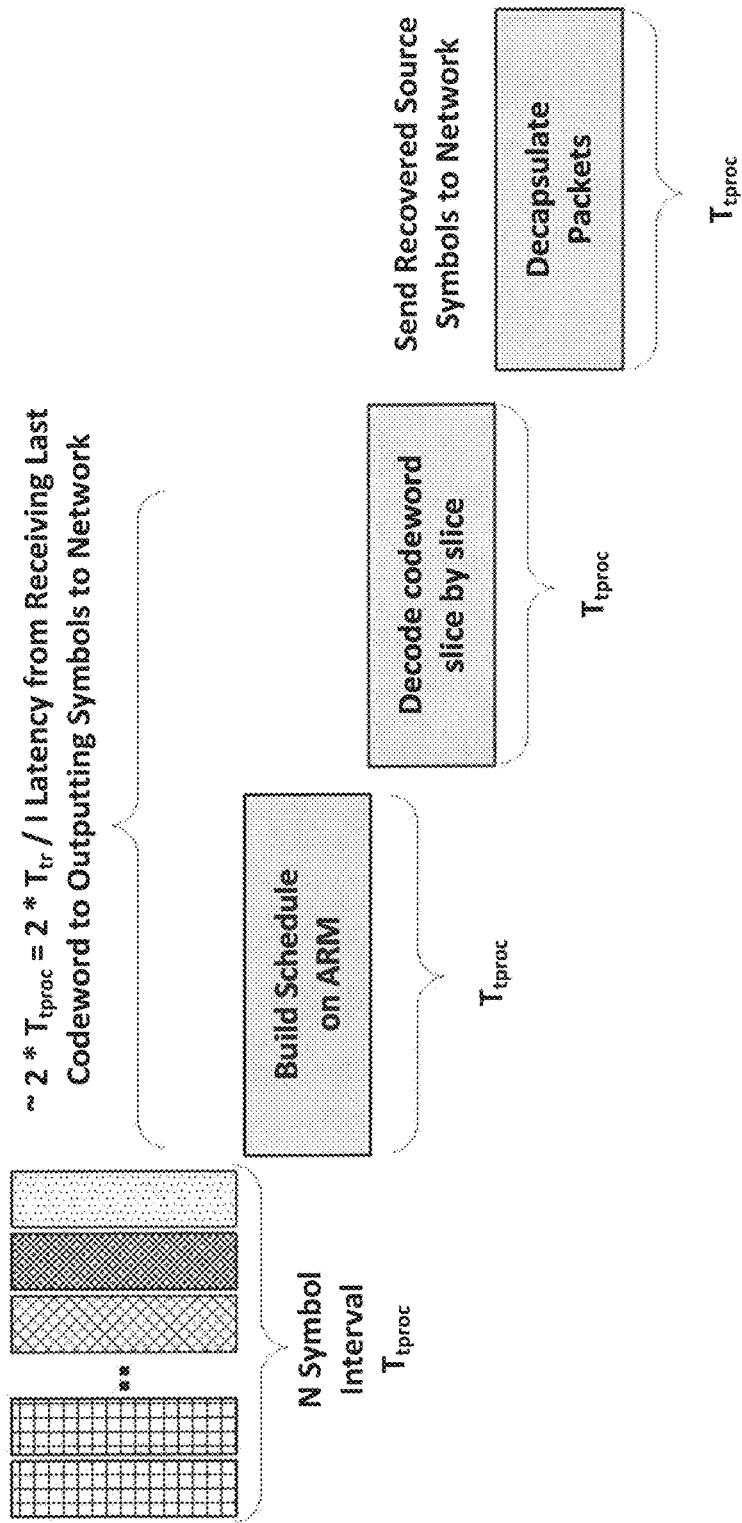
FIG. 14 illustrates a decode timeline.

FIG. 14 illustrates a decode timeline. A decoder that is provisioned to just meet the throughput requirement will take nearly $N=a^2 I$ transmit symbol periods to decode. Shortening the latency would require over-provisioning the decoder. A typical codeword transmission spans NI symbol periods, so the latency/transmission ratio for minimally provisioned decoding is 1/I. For example, in the case of a protection period of 150 ms and 30 interlaces, the decoding latency will be approximately 5 ms. For the parameters above, this would correspond to approximately N=364. With 20 interlaces, the decoding latency would be 7.5 ms and a suitable design value would be N=546.

As described it takes I*N symbol periods (approximately one protection period) to cover a starting point for each stream. For a synchronous start design, the source stream could be padded with zeros prior to the actual starting point. The first I codewords would then be at an effectively lower code rate. An alternative would be some more complex packing of possibly smaller codewords to initiate the transmission.

In other variations, the encoder can operate with fixed interval codewords and variable interval codewords. In some variations, the decoder does not necessarily provide in-order packet delivery.

Using one or more of the elements, techniques and/or components described above, a suitable data transmission system, transmitters and receivers can be designed. Further embodiments can be envisioned to one of ordinary skill in the art after reading this disclosure. In other embodiments, combinations or sub-combinations of the above disclosed invention can be advantageously made. The example arrangements of components are shown for purposes of illustration and it should be understood that combinations, additions, re-arrangements, and the like are contemplated in alternative embodiments of the present invention. Thus, while the invention has been described with respect to exemplary embodiments, one skilled in the art will recognize that numerous modifications are possible.

The terminology used herein is for the purpose of describing particular implementations only and is not intended to be limiting of the disclosure. It will be understood by those within the art that if a specific number of a claim element is intended, such intent will be explicitly recited in the claim, and in the absence of such recitation, no such intent is present. For example, as used herein, the singular forms "a", "an" and "the" are intended to include the plural forms as well, unless the context clearly indicates otherwise. As used herein, the term "and/or" includes any and all combinations of one or more of the associated listed items. It will be further understood that the terms "comprises," "comprising," "includes," and "including," when used in this specification, specify the presence of stated features, integers, steps, operations, elements, and/or components, but do not preclude the presence or addition of one or more other features, integers, steps, operations, elements, components, and/or groups thereof. Expressions such as "at least one of," when preceding a list of elements, modify the entire list of elements and do not modify the individual elements of the list.

For example, the processes described herein may be implemented using hardware components, software components, and/or any combination thereof. The specification and drawings are, accordingly, to be regarded in an illustrative rather than a restrictive sense. It will, however, be evident that various modifications and changes may be made thereunto without departing from the broader spirit and scope of the invention as set forth in the claims and that the invention is intended to cover all modifications and equivalents within the scope of the following claims.

Operations of processes described herein can be performed in any suitable order unless otherwise indicated herein or otherwise clearly contradicted by context. Processes described herein (or variations and/or combinations thereof) may be performed under the control of one or more computer systems configured with executable instructions and may be implemented as code (e.g., executable instructions, one or more computer programs or one or more applications) executing collectively on one or more processors, by hardware or combinations thereof. Further embodiments include a non-transitory processor-readable medium on which is stored processor-executable instructions configured to cause a computing device to perform operations of processes described herein. The use of any and all examples is intended merely to better illuminate embodiments of the invention and does not pose a limitation on the scope of the invention unless otherwise claimed. No language in the specification should be construed as indicating any non-claimed element as essential to the practice of the invention.

What is claimed is:

1. A method of encoding data for transmission comprising:
    receiving source symbols in a first sequence;
    storing the source symbols to a first memory in a second sequence, wherein the first sequence is a first interlacing relative to the second sequence;
    determining if the first memory contains all source symbols of a codeword, wherein the source symbols of a codeword are the symbols used to generate repair symbols for that codeword;
    generating repair symbols for the codeword;
    storing the repair symbols to a second memory in a third sequence;
    interlacing the repair symbols and the source symbols into an output stream as a stream of encoded symbols, wherein the repair symbols appear in the output stream in a fourth sequence, wherein the fourth sequence is a second interlacing relative to the third sequence; and
    outputting the stream of encoded symbols.

2. The method of claim 1, further comprising:
    receiving additional source symbols in the first sequence, the additional source symbols comprising a plurality of additional codewords;
    storing the additional source symbols of the plurality of additional codewords in the first memory in the second sequence;
    determining which of the additional codewords are complete codewords in the first memory;
    for each of the complete codewords, generating repair symbols;
    storing the repair symbols for each of the complete codewords to the second memory in the third sequence; and
    interlacing the repair symbols and the source symbols for each of the complete codewords into the output stream as the stream of encoded symbols prior to the outputting of the stream of encoded symbols.

3. The method of claim 1, wherein the first interlacing and the second interlacing are equal.

4. The method of claim 1, wherein the first interlacing and the second interlacing are determined from a target line rate, a specified protection period, and a specified symbol size.

5. The method of claim 1, further comprising:
    generating an encoding schedule in advance of receiving the source symbols; and
    allocating codewords in the encoding schedule to stagger completion times of the codewords, wherein a completion time of a given codeword is a time at which a decoder obtains, or is scheduled to obtain, a last symbol of the given codeword.

6. The method of claim 1, wherein the first memory and the second memory are each distinct memory locations in one common memory structure.

7. An encoder for encoding data for transmission comprising:
- an input for receiving source symbols in a first sequence;
- a first memory having storage for the source symbols corresponding to a codeword, wherein the source symbols corresponding to the codeword are symbols used to generate repair symbols for the codeword;
- logic for storing the source symbols of the codeword to the first memory in a second sequence, wherein the first sequence is a first interlacing relative to the second sequence;
- a repair encoder for generating repair symbols for the source symbols of the codeword;
- a second memory having storage for storing the repair symbols in a third sequence;
- an interlacer that interlaces the repair symbols and the source symbols into an output stream as a stream of encoded symbols, wherein the repair symbols appear in the output stream in a fourth sequence, wherein the fourth sequence is a second interlacing relative to the third sequence; and
- an output for outputting the stream of encoded symbols.

8. The encoder of claim 7, further comprising storage in memory for a plurality of additional source symbols in the first sequence, the additional source symbols comprising a plurality of additional codewords and storage in memory for the repair symbols for each of the plurality of additional codewords in the third sequence.

9. The encoder of claim 7, wherein the first interlacing and the second interlacing are equal.

10. The encoder of claim 7, wherein the first interlacing and the second interlacing are determined from a target line rate, a specified protection period, and a specified symbol size.

11. The encoder of claim 7, further comprising:
- storage for an encoding schedule generated in advance of receiving the source symbols, wherein codewords in the encoding schedule have staggered completion times of the codewords, wherein a completion time of a given codeword is a time at which a decoder obtains, or is scheduled to obtain, a last symbol of the given codeword.

12. The encoder of claim 7, wherein the first memory and the second memory are each distinct memory locations in one common memory structure.

* * * * *